(12) United States Patent
Shin et al.

(10) Patent No.: US 10,788,440 B2
(45) Date of Patent: Sep. 29, 2020

(54) BIOSENSOR

(71) Applicant: LG Chem, Ltd., Seoul (KR)

(72) Inventors: Hang Beum Shin, Daejeon (KR); Young Do Jeong, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 16/463,214

(22) PCT Filed: Nov. 16, 2017

(86) PCT No.: PCT/KR2017/012999
§ 371 (c)(1),
(2) Date: May 22, 2019

(87) PCT Pub. No.: WO2018/097538
PCT Pub. Date: May 31, 2018

(65) Prior Publication Data
US 2019/0346397 A1 Nov. 14, 2019

(30) Foreign Application Priority Data

Nov. 23, 2016 (KR) .................. 10-2016-0156375

(51) Int. Cl.
*H01L 29/78* (2006.01)
*G01N 27/327* (2006.01)
*G01N 27/414* (2006.01)

(52) U.S. Cl.
CPC ........... *G01N 27/327* (2013.01); *H01L 29/78* (2013.01); *G01N 27/4145* (2013.01); *G01N 27/4148* (2013.01)

(58) Field of Classification Search
CPC .................................................. H01L 29/7869
See application file for complete search history.

(56) References Cited

U.S. PATENT DOCUMENTS

| 2010/0072976 | A1 | 3/2010 | Sheu et al. | |
|---|---|---|---|---|
| 2011/0291673 | A1* | 12/2011 | Shibata | G01N 27/4145 324/649 |
| 2015/0276663 | A1* | 10/2015 | Takechi | H01L 29/7869 257/253 |
| 2015/0330941 | A1* | 11/2015 | Smith | H01L 27/1218 257/253 |

FOREIGN PATENT DOCUMENTS

| JP | 5682270 B2 | 3/2015 |
|---|---|---|
| KR | 20090131918 A | 12/2009 |
| KR | 20110032172 A | 3/2011 |
| KR | 1217576 B1 | 12/2012 |
| KR | 1242138 | 3/2013 |

OTHER PUBLICATIONS

International Search Report dated Feb. 20, 2018, in PCT/KR2017/012999, with English translation.

* cited by examiner

*Primary Examiner* — Moazzam Hossain
(74) *Attorney, Agent, or Firm* — Lerner, David, Littenberg, Krumholz & Mentlik, LLP

(57) ABSTRACT

Invention biosensor that can be easily manufactured by a printing technique, can be mass-produced, and can measure a large amount of detection factors individually/continuously.

13 Claims, 2 Drawing Sheets

[Figure 1]
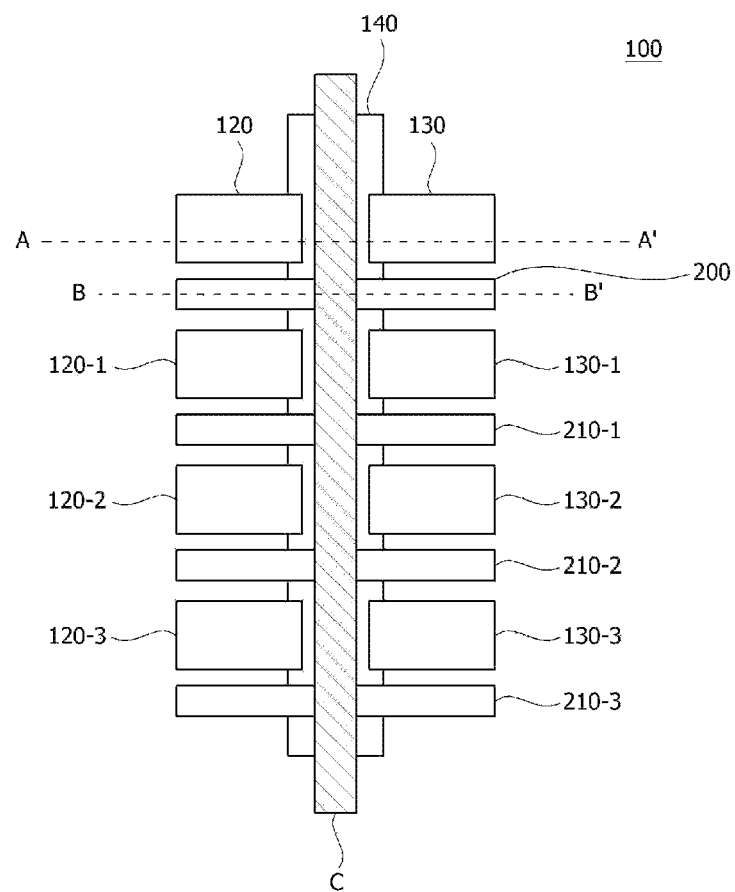

[Figure 2]
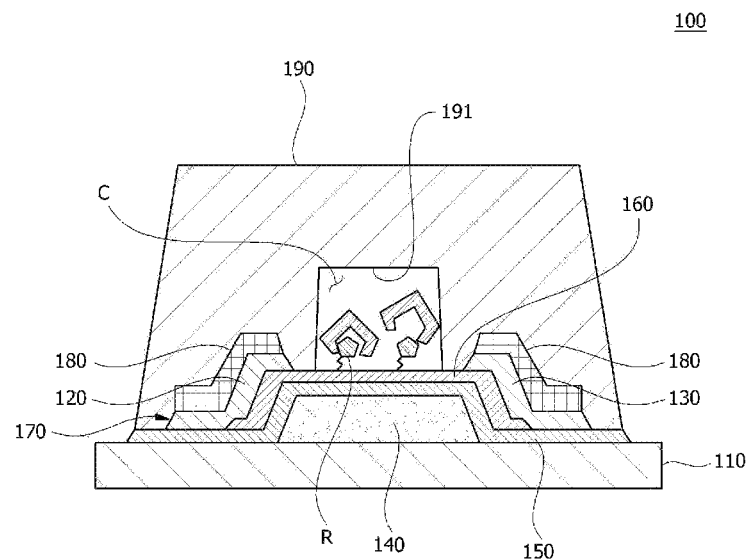
[Figure 3]
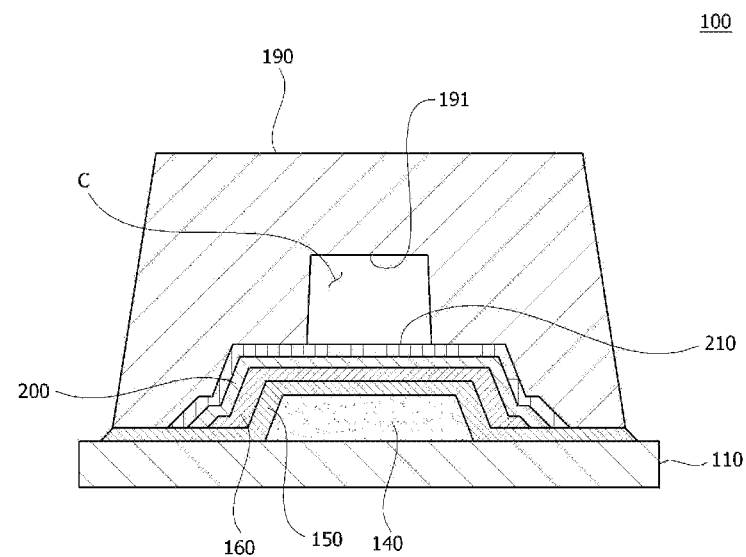

BIOSENSOR

CROSS-REFERENCE TO RELATED APPLICATIONS

The present application is a national phase entry under 35 U.S.C. § 371 of International Application No. PCT/KR2017/012999 filed Nov. 16, 2017, published in Korean, which claims priority from Korean Patent Application No. 10-2016-0156375 filed Nov. 23, 2016, all of which are incorporated herein by reference.

TECHNICAL FIELD

The present invention relates to a biosensor.

BACKGROUND ART

Among biosensors that detect biomaterials, researches on transistor-based biosensors have been actively conducted.

On the other hand, conventional biosensors for adsorbing/measuring liquid molecules using a transistor have been made by pouring a liquid from above and have been used by immersing Ag/AgCl, which is a reference electrode, on this solution, but they are not only difficult to quantitatively measure a precise solution, but also have a problem that it is difficult to form a three-dimensional reference electrode on a mass production type printed-electrode substrate.

DISCLOSURE

Technical Problem

It is one problem to be resolved by the present invention to provide a biosensor capable of easily manufacturing a thin film type biosensor element comprising a reference electrode layer by a printing technique and capable of mass production.

Also, it is another problem to be resolved by the present invention to provide a biosensor capable of individually/continuously measuring a large amount of detection factors in one solution.

Technical Solution

To solve the above-described problems, the biosensor related to one aspect of the present invention comprises a sensing part, and a cover member mounted on the sensing part and forming a fluid channel in a space therebetween.

The sensing part comprises a substrate, a gate electrode provided on the substrate, an insulating layer provided on the gate electrode, an n-type channel formed on the insulating layer, and a first electrode layer including a source electrode on the n-type channel layer and a drain electrode on the n-type channel layer. The source electrode and drain electrode are located apart from each other on the n-type channel layer such that a portion of the n-type channel is exposed between the source electrode and the drain electrode.

Also, the sensing part comprises a second electrode layer provided so as to surround the first electrode layer, and a third electrode layer located on the substrate and formed of the same material as the first electrode layer.

Furthermore, the sensing part comprises a fourth electrode layer provided so as to surround the third electrode layer, formed of the same material as the second electrode layer and providing a reference electrode.

In addition, the cover member has an inner periphery surrounding the portion of the n-type channel exposed between the source electrode and the drain electrode in the first electrode layer, and surrounding at least a portion of the reference electrode.

Additionally, the cover member forms a fluid channel provided so that a fluid can enter into a space between the n-type channel and the inner periphery and into a space between the reference electrode and the inner periphery.

Advantageous Effects

As described above, according to the biosensor related to at least one example of the present invention, it can easily manufacture a thin film type biosensor element comprising a reference electrode layer by a printing technique, is capable of mass production, and can measure a large amount of detection factors individually/continuously.

BRIEF DESCRIPTION OF DRAWINGS

FIG. 1 is a conceptual diagram of a biosensor related to one example of the present invention.

FIG. 2 is a cross-sectional view of a state cut along the line A-A' in FIG. 1.

FIG. 3 is a cross-sectional view of a state cut along the line B-B' in FIG. 1.

DETAILED DESCRIPTION

Hereinafter, a biosensor according to one example of the present invention will be described in detail with reference to the accompanying drawings.

In addition, the same or similar reference numerals are given to the same or corresponding components regardless of reference numerals, of which redundant explanations will be omitted, and for convenience of explanation, the size and shape of each constituent member as shown may be exaggerated or reduced.

FIG. 1 is a conceptual diagram of a biosensor related to one example of the present invention, FIG. 2 is a cross-sectional view of a state cut along the line A-A' in FIG. 1, and FIG. 3 is a cross-sectional view of a state cut along the line B-B' in FIG. 1.

Referring to FIGS. 2 and 3, the biosensor (100) comprises a sensing part and a cover member (190) mounted on the sensing part and forming a fluid channel (C) in a space therebetween.

The sensing part comprises a substrate (110), a gate electrode (140), an insulating layer (150), an n-type channel (160), a first electrode layer (170), a second electrode layer (180), a third electrode layer (200), and a fourth electrode layer (210).

The first electrode layer (170) forms a source electrode (120) and a drain electrode (130) on the n-type channel (160), respectively.

Referring to FIG. 2, the second electrode layer (180) is provided to surround the first electrode layer (170). Specifically, the second electrode layer (180) is provided to surround the source electrode (120) and the drain electrode (130), which are the first electrode layer (170), respectively.

Referring to FIG. 3, the biosensor (100) comprises a third electrode layer (200) located on the substrate (110) and formed of the same material as the first electrode layer (170), and a fourth electrode layer (210) provided so as to surround the third electrode layer (200), formed of the same material as the second electrode layer (180) and providing a reference electrode.

Specifically, the biosensor (100) comprises a substrate (110), a gate electrode (140) provided on the substrate (110), an insulating layer (150) provided on the gate electrode (140), and an n-type channel (160) provided on the insulating layer (150).

As the substrate (110), a glass substrate or a plastic substrate may be used, and it is not particularly limited as long as it is applied to the biosensor (100).

The gate electrode (140) may be formed of a metal, which may be selected from the group consisting of, for example, chromium (Cr), molybdenum (Mo), aluminum (Al), titanium/silver (Ti/Ag), gold (Au), copper (Cu) and platinum (Pt).

Also, the insulating layer (150) may be formed of SiO2, Al2O3, TiO2, ZrO2, HfO2, SiNx, or the like.

The usable n-type channel (160) in the present invention may be made of any one n-type material selected from the group consisting of IGZO, ZnO, ZTO, IZO, IHZO, AlN, InN, GaN and InGaN.

In particular, the n-type channel (160) made of IGZO is preferable because it has excellent optical transparency, amorphous structure, high electron mobility, and further, the IGZO channel can function as an active matrix backplane, so that it has an advantage that a separate integration process can be omitted.

Also, the biosensor (100) comprises a source electrode (120) and a drain electrode (130), provided apart at a predetermined interval, on the n-type channel (160). Furthermore, the biosensor (100) comprises a second electrode layer (180) provided to surround the source electrode (120) and the drain electrode (130), which are the first electrode layer (170), respectively, and a fourth electrode layer (210) located apart from the source electrode (120) and the drain electrode (130), formed of the same material as the second electrode layer (180) and providing a reference electrode.

The source electrode (120) and the drain electrode (130), which are the first electrode layer (170), may be formed of a metal, which may be selected from the group consisting of, for example, chromium (Cr), titanium/silver (Ti/Ag), molybdenum (Mo), aluminum (Al), silver (Ag), copper (Cu), platinum (Pt) and tungsten (W).

Furthermore, the biosensor (100) comprises a cover member (190) having an inner periphery (191) surrounding the n-type channel layer (160) exposed between the source electrode (120) and the drain electrode (130), and some areas of the reference electrode together. The cover member (190) forms a fluid channel (C) provided so that a fluid (for example, a sample solution) can enter into a space between the exposed n-type channel (160) and the inner periphery (191) and a space between the reference electrode, which is the fourth electrode layer (210), and the inner periphery (191). The cover member (190) may be formed of silicone or the like, and for example, may be formed of PDMS. In addition, a collecting part (R) may also be provided on the n-type channel (160) exposed to the inside of the fluid channel (C).

The source electrode (120) and the drain electrode (130), which are the first electrode layer (170), are located outside the fluid channel (C). That is, the source electrode (120) and the drain electrode (130) are provided so as not to be in direct contact with a sample solution. Also, the reference electrode, which is the fourth electrode layer (210), is exposed to the inside of the fluid channel (C) so as to be in contact with the sample solution.

Meanwhile, the second electrode layer (180) and the first electrode layer (170) may be formed of different materials (for example, different metal materials). Also, the second electrode layer (180) and the fourth electrode layer (210) may be formed of, for example, a noble metal, and specifically, may be formed of one or more selected from the group consisting of gold (Au), palladium (Pd), platinum (Pt), silver (Ag), and ruthenium (Ru).

Referring to FIG. 3, the gate electrode (140) and the insulating layer (150) may be sequentially located between the substrate (110) and the third electrode layer (200). In addition, the n-type channel (160) may be sequentially located between the insulating layer (150) and the third electrode layer (200).

This is for simplification of manufacturing processes, where it is not necessary that the fourth electrode layer (210) is formed on the n-type channel (160) or on the third electrode layer (200). That is, the fourth electrode layer (210) providing a reference electrode may be formed such that it is disposed on the substrate (110), and thus some areas are located in the fluid channel (C).

However, reviewing the manufacturing process of the biosensor (100), when the source electrode (120) and the drain electrode (130), which are the first electrode layer (170), are formed together with the third electrode layer (200), the third electrode layer (200) may be formed even on the bottom of the fourth electrode layer (210). Also, the first electrode layer (170) and the third electrode layer (200) may be formed and then the second electrode layer (180) and the fourth electrode layer (210) may be formed with the same mask. That is, by using a printing technique, the manufacturing process can be simplified.

When a constant voltage is applied between the source electrode (120) and the gate electrode (140) in a TFT, a conduction channel is formed in the n-type channel (160), whereby electrons can move between the source electrode (120) and the drain electrode (130). Then, when target biomolecules of the sample solution are adsorbed and the potential energy of the surface is changed, the amount of current flowing through the n-type conduction channel (160) is changed, so that the presence or concentration of the target biomolecules is calculated from such a change of current.

Referring to FIG. 1, the biosensor (100) may be provided so that a large amount of detection factors can be individually/continuously measured in one solution.

To this end, the biosensor (100) comprises a substrate (110), a gate electrode (140) elongated along a first direction on the substrate (110), an insulating layer (150) provided on the gate electrode (140), and an n-type channel (160) provided on the insulating layer (150).

Also, the biosensor (100) comprises a first electrode layer (170) forming a first source electrode (120-1) and a first drain electrode (130-1), provided apart at a predetermined interval along a second direction different from the first direction on the n-type channel (160), and a second source electrode (120-2) and a second drain electrode (130-2), located apart from the first source electrode (120-1) and the first drain electrode (130-1) along the first direction and provided apart at a predetermined interval along the second direction on the n-type channel (160), respectively. The first direction may indicate a direction in which a fluid flows in the fluid channel, and the second direction may indicate a connection line direction of the source electrode and the drain electrode. Furthermore, the first direction and the second direction may be directions substantially orthogonal to each other.

Referring to FIG. 2, the biosensor (100) comprises a second electrode layer (180) provided so as to surround the source electrode (120) and the drain electrode (130), which are the first electrode layer (170), respectively.

Referring to FIG. 3, the biosensor (100) comprises a third electrode layer (200) located on the substrate (110) and formed of the same material as the first electrode layer (170). Also, the biosensor (100) comprises a fourth electrode layer (210) provided on the third electrode layer (200), where the fourth electrode layer (210) provides a first reference electrode and a second reference electrode, respectively. At this time, the first reference electrode (210-1) constitutes a first sensing part with the first source/drain electrodes (120-1, 130-1), and the second reference electrode (210-2) constitutes a second sensing part with the second source/drain electrodes (120-2, 130-2).

Specifically, the fourth electrode layer (210) comprises the first reference electrode (210-1) located apart from the first source electrode (120-1) and the first drain electrode (130-1) along the first direction and formed of the same material as the second electrode layer (180) so as to surround the third electrode layer (200), and the second reference electrode located apart from the second source electrode (120-2) and the second drain electrode (130-2) along the first direction and formed of the same material as the second electrode layer (180) so as to surround the third electrode layer (200).

In the biosensor (100), one sensor (first sensing part) function is performed by setting the first reference electrode (210-1) to the reference potential of a reaction and measuring the current between the first source electrode (120-1) and the first drain electrode (130-1). Also, another sensor (second sensing part) function is performed by setting the second reference electrode (210-2) to the reference potential of a reaction and measuring the current between the second source electrode (120-2) and the second drain electrode (130-2). In this way, a plurality of sensing parts can be formed in one fluid channel (C).

Also, the biosensor (100) comprises a cover member (190), where the cover member (190) has an inner periphery (191) surrounding the n-type channel exposed between the first source electrode (120-1) and the first drain electrode (130-1), the n-type channel exposed between the second source electrode (120-2) and the second drain electrode (130-2) and some areas of each of the first and second reference electrodes together. Then, the cover member (190) forms a fluid channel (C) provided such that a fluid can enter into a space between the exposed n-type channels and the inner periphery and a space between the first and second reference electrodes and the inner periphery.

As described above, the fluid channel (C) is elongated along the first direction. In addition, the first source and drain electrodes (120-1, 130-1), the first reference electrode (210-1), the second source and drain electrodes (120-2, 130-2), and the second reference electrode (210-2) are sequentially positioned.

The first source and first drain electrodes (120-1, 130-1) and the second source and drain electrodes (120-2, 130-2) are the same as the source and drain electrodes (120, 130) as described above, respectively, but only the positions formed along the first direction on the gate electrode are different. Also, the first and second reference electrodes (210-1, 210-2) are the same as the reference electrode as described above.

On the other hand, the first sensing part and the second sensing part are provided to be independently drivable. That is, the biosensor (100) may comprise a plurality of sensing parts, and the sensing parts may be each provided to be independently drivable. Also, when the sample solution flows into the fluid channel (C), the biosensor (100) has a structure in which a number of sensing parts are arranged along the fluid channel (C).

It is not necessary that the first and second reference electrodes (210-1, 210-2) are formed on the n-type channel (160) or on the third electrode layer (200). That is, each of the reference electrodes (210-1, 210-2) may be formed such that it is disposed on the substrate (110), and thus some areas are located in the fluid channel (C).

As described above, reviewing the manufacturing process of the biosensor (100), when the first electrode layer (170) is formed, the third electrode layer (200) may be formed even on the bottom of the relevant reference electrodes (200-1, 200-2).

Referring to FIG. 3, a substrate (110), a gate electrode (140), an insulating layer (150), an n-type channel (160), a third electrode layer (200) and a fourth electrode layer (210) may be sequentially provided. Also, the second electrode layer (180) and the fourth electrode layer (210) may be formed simultaneously with the same mask used to form the first electrode layer (170) and the third electrode layer (200), and thus the manufacturing process can be simplified by using the printing technique.

Also, the biosensor (100) related to one example of the present invention may comprise N (N>1) sensing parts, and for example, may comprise a third sensing part containing a third source electrode (120-3) and a third drain electrode (130-3), and a third reference electrode (210-3).

The preferred example of the present invention as described above is disclosed for exemplary purpose, where those skilled in the art having ordinary knowledge for the present invention can make various corrections, modifications and additions within idea and scope of the present invention, and such a correction, modification and addition should be considered as falling within the scope of the following claims.

INDUSTRIAL APPLICABILITY

According to the biosensor related to at least one example of the present invention, it can easily manufacture a thin film type biosensor element comprising a reference electrode layer by a printing technique, is capable of mass production, and can measure a large amount of detection factors individually/continuously.

The invention claimed is:
1. A biosensor comprising:
a substrate;
a gate electrode provided on the substrate;
an insulating layer provided on the gate electrode;
an n-type channel provided on the insulating layer;
a first electrode layer including a source electrode on the n-type channel and a drain electrode on the n-type channel, wherein a portion of the n-type channel is exposed between the source electrode and the drain electrode;
a second electrode layer provided so as to surround the first electrode layer;
a third electrode layer located on the substrate and formed of the same material as the first electrode layer;
a fourth electrode layer provided so as to surround the third electrode layer, formed of the same material as the second electrode layer and providing a reference electrode; and a cover member having an inner periphery surrounding the portion of the n-type channel exposed between the source electrode and the drain electrode of the first electrode layer, and surrounding at least a portion of the reference electrode, wherein the cover member forms a fluid channel provided such that a fluid can enter into:
   a space between the n-type channel and the inner periphery, and
   a space between the reference electrode and the inner periphery.

2. The biosensor according to claim 1,
wherein the first electrode layer is formed from a material different than the material from which the second electrode layer is formed.

3. The biosensor according to claim 2,
wherein the second electrode layer is formed of one or more materials selected from the group consisting of gold (Au), palladium (Pd), platinum (Pt), silver (Ag) and ruthenium (Ru).

4. The biosensor according to claim 1,
wherein the n-type channel comprises an n-type material selected from the group consisting of IGZO, ZnO, ZTO, IZO, IHZO, AlN, InN, GaN and InGaN.

5. The biosensor according to claim 1,
wherein the source electrode and the drain electrode are located outside the fluid channel.

6. The biosensor according to claim 1,
wherein the gate electrode and the insulating layer are sequentially located between the substrate and the third electrode layer.

7. The biosensor according to claim 6,
wherein the n-type channel is located between the insulating layer and the third electrode layer.

8. A biosensor comprising:
a substrate;
a gate electrode elongated along a first direction on the substrate;
an insulating layer provided on the gate electrode;
an n-type channel provided on the insulating layer;
a first electrode layer including:
   a first source electrode on the n-type channel and a first drain electrode on the n-type channel, the first source electrode and first drain electrode being separate from each other along a second direction different from the first direction, wherein a first portion of the n-type channel is exposed between the first source electrode and the first drain electrode, and
   a second source electrode on the n-type channel and a second drain electrode on the n-type channel, the second source electrode and the second drain electrode being separate from the first source electrode and the first drain electrode along the first direction, and separate from each other at a predetermined interval along the second direction, wherein a second portion of the n-type channel is exposed between the second source electrode and the second drain electrode;
a second electrode layer surrounding the first electrode layer;
a third electrode layer located on the substrate and formed of the same material as the first electrode layer;
a fourth electrode layer including:
   a first reference electrode separate from the first source electrode and the first drain electrode along the first direction and formed of the same material as the second electrode layer so as to surround the third electrode layer, and
   a second reference electrode separate from the second source electrode and the second drain electrode along the first direction and formed of the same material as the second electrode layer so as to surround the third electrode layer, respectively; and
a cover member having an inner periphery surrounding the first portion of the n-type channel exposed between the first source electrode and the first drain electrode, surrounding the second portion of the n-type channel exposed between the second source electrode and the second drain electrode, and surrounding at least a portion of the first and second reference electrodes, wherein the cover member forms a fluid channel provided such that a fluid can enter into:
   a space between the first and second portions of the n-type channel and the inner periphery, and
   a space between the first and second reference electrodes and the inner periphery.

9. The biosensor according to claim 8,
wherein the first source electrode, the first drain electrode and the first reference electrode are configured to constitute a first sensing part, and
the second source electrode, the second drain electrode and the second reference electrode are configured to constitute a second sensing part.

10. The biosensor according to claim 9,
wherein the first sensing part and the second sensing part are configured to be independently drivable.

11. The biosensor according to claim 8,
wherein the first electrode layer is formed from a material different than the material from which the second electrode layer is formed.

12. The biosensor according to claim 11,
wherein the second electrode layer is formed of one or more materials selected from the group consisting of gold (Au), palladium (Pd), platinum (Pt), silver (Ag) and ruthenium (Ru).

13. The biosensor according to claim 8,
wherein the first and second source electrodes and the first and second drain electrodes are located outside the fluid channel.

* * * * *